United States Patent [19]

Shouno

[11] Patent Number: 5,321,296
[45] Date of Patent: Jun. 14, 1994

[54] SEMICONDUCTOR DEVICE HAVING AN INTERCONNECTION LAYER OF A POLYSILICON LAYER AND A METALLIC LAYER

[75] Inventor: Naoki Shouno, Kanagawa, Japan

[73] Assignee: Kabushiki Kaisha Toshiba, Kanagawa, Japan

[21] Appl. No.: 804,386

[22] Filed: Dec. 9, 1991

[30] Foreign Application Priority Data

Dec. 10, 1990 [JP] Japan .................. 2-401081

[51] Int. Cl.$^5$ ............................................. H01L 29/04
[52] U.S. Cl. .................................... 257/412; 257/754
[58] Field of Search ............... 257/754, 752, 756, 387, 257/390, 395, 412, 377, 381, 382, 383, 384, 385, 387, 388, 389

[56] References Cited

U.S. PATENT DOCUMENTS 4,146,902  3/1979  Tanimoto et al. ................ 257/390
4,916,521  4/1990  Yoshikawa et al. .............. 257/412
5,136,361  8/1992  Wollesen et al. ................ 257/754

Primary Examiner—Rolf Hille
Assistant Examiner—S. V. Clark
Attorney, Agent, or Firm—Finnegan, Henderson, Farabow, Garrett & Dunner

[57] ABSTRACT

There is disclosed a semiconductor device which has a first insulating film formed on a surface of a semiconductor substrate, a polysilicon layer formed on the first insulating film, a second insulating film formed on the polysilicon layer, and a metallic interconnection layer formed on the second insulating film. The polysilicon layer is formed thicker at a connection portion than other portions and is connected to the metallic interconnection layer via a hole formed in the second insulating layer. The film thickness of the polysilicon layer is large at the contact forming portion so that it is possible to prevent the contact hole from being formed passing through the polysilicon layer even if the lower polysilicon layer is excessively etched during the contact hole forming process.

4 Claims, 2 Drawing Sheets

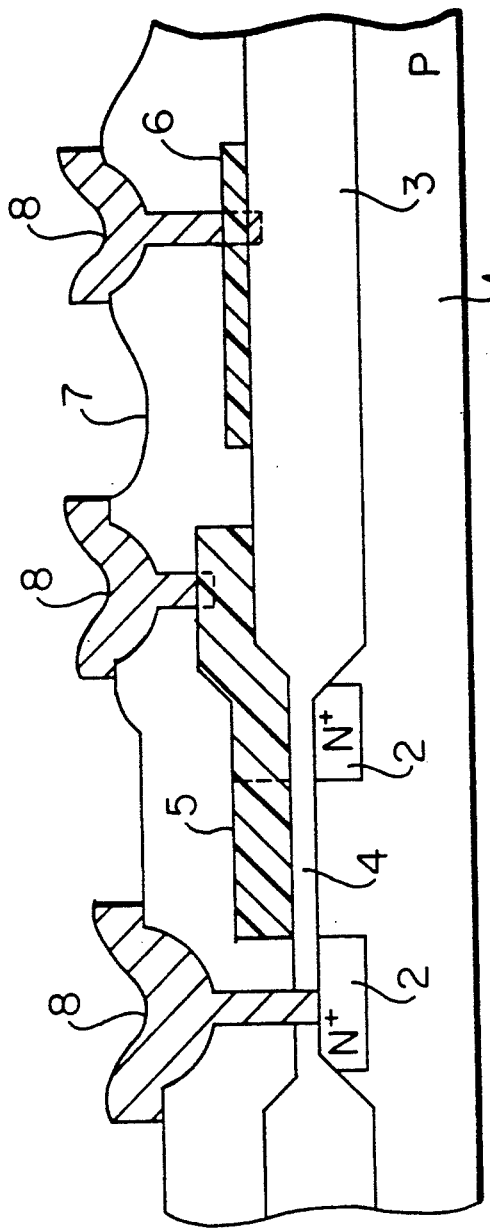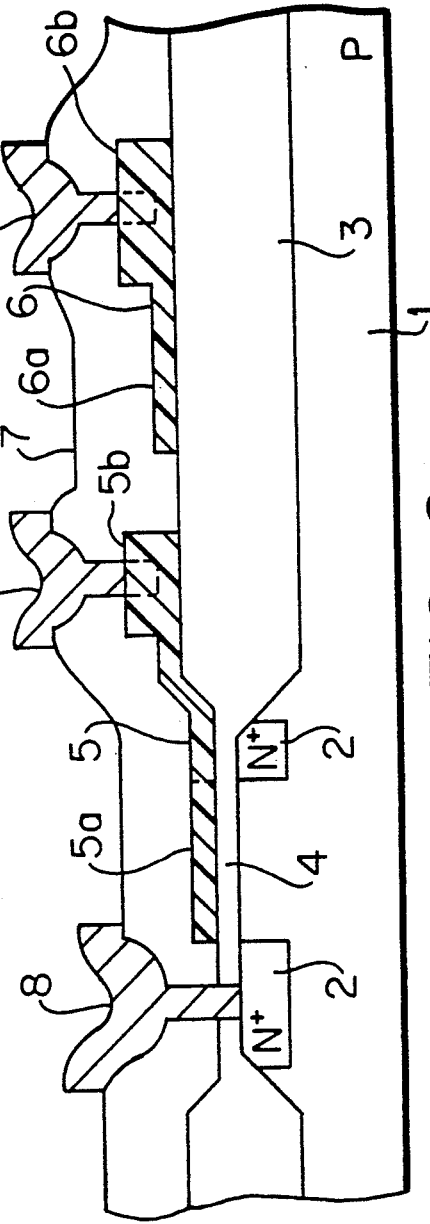
FIG. 1 PRIOR ART
FIG. 2

SEMICONDUCTOR DEVICE HAVING AN INTERCONNECTION LAYER OF A POLYSILICON LAYER AND A METALLIC LAYER

BACKGROUND OF THE INVENT

1. Field of the Invention

The present invention relates to a semiconductor device, and more specifically to an MOS semiconductor device using a polysilicon layer as an interconnection layer.

2. Description of the Related Art

Generally, in semiconductor devices, or in MOS semiconductor devices in particular, a polysilicon layer formed by doping impurities is often used as an electrode or an interconnection layer. Further, aluminum is usually used as the interconnection material. Accordingly, a polysilicon layer is electrically connected to an aluminum layer in such a way that the polysilicon interconnection layer and the aluminum interconnection layer are laminated, disposing an interlayer insulating film therebetween, and then both the layers are connected to each other via a hole formed in the insulating film.

In more detail, in a conventional semiconductor device, an insulating film is formed to cover a polysilicon layer, a contact hole is formed in the insulating film, an aluminum layer is formed on the insulating film, and the polysilicon layer is connected to the aluminum layer via the contact hole.

With the advance of semiconductor manufacturing technology, recently there exists a tendency that the difference in level in an interlayer insulating film on which an interconnection layer is formed can be reduced and additionally the film thickness of the polysilicon layer can be reduced owing to the progress of micromanufacturing technology.

Further, although conventionally the contact holes have been formed by wet etching technique, recently dry etching is often used to form the contact hole.

As described above, in order to form a contact hole for interconnection between the two layers, it is necessary to form a desired contact hole in the insulating film formed on the surface of the polysilicon layer by dry etching. In this process, it is indispensable to etch only the insulating film without etching the polysilicon layer under the insulating film, by appropriately determining etching gas and etching conditions. In general, however, since the dry etching conditions are determined so that the insulating film can be removed perfectly for providing a secure connection, by utilizing a difference in etching rate between the insulating film and the polysilicon layer, it is unavoidable that the polysilicon layer is etched even slightly.

In the conventional device, as described above and as shown in FIG. 1, where a polysilicon layer 6 is reduced in thickness, there exists a problem in that the contact hole is formed passing through the polysilicon layer 6 into a field isolation oxide film 3 under the polysilicon layer 6, without being stopped at the polysilicon layer 6, as depicted on the right side in FIG. 1.

When an aluminum layer is formed on the upper layer, the electric contact between the aluminum interconnection layer and the polysilicon layer cannot be achieved normally, with the result that the contact resistance increases or, in the worst case, both the layers are not connected electrically.

SUMMARY OF THE INVENTION

The present invention has been achieved to solve the above-mentioned drawbacks. The object of the present invention is to provide a semiconductor device in which electrical connection between a lower polysilicon layer and an upper metallic interconnection layer can be reliably achieved.

To achieve the above-mentioned object, the present invention in one aspect, provides a semiconductor device comprising a semiconductor substrate having a surface, a first insulating layer formed on the surface of the semiconductor substrate, and a polysilicon layer formed on the first insulating layer. The polysilicon layer comprises a connection portion and a remaining portion, and the connection portion has a greater thickness than the remaining portion The device also comprises a second insulating layer formed on the polysilicon layer having a hole formed therein above the connection portion, and a metallic interconnection layer formed on the second insulating layer. The metallic interconnection layer has a portion extending through the hole to forth electrical contact with the connection portion, whereby the polysilicon layer is connected to the metallic interconnection layer via the hole.

In another aspect, the invention provides a method of manufacturing a semiconductor device. The method comprises the steps of forming a field region and a gate insulating layer on a semiconductor substrate by selective oxidation; forming a first polysilicon layer having a portion defining a gate region; etching the first polysilicon layer to form a first contact area having a greater thickness than the thickness of the gate region, forming a second polysilicon layer; etching the second polysilicon layer to form a horizontal contact area and a vertical contact area, the thickness at the vertical contact area being greater than the thickness of the horizontal contact area; forming an impurity region constituting a source-drain area; forming an insulating layer on the source-drain area and the field region; forming a first hole in the insulating layer and first contact area by dry etching; and forming a metallic layer on the insulating layer to form an electrical connection through the first hole to the first contact area.

In the device according to the present invention, the film thickness of the polysilicon layer is different between the interconnection portion and the contact forming portion with the metallic interconnection layer; that is, the film thickness is large at the contact forming portion. Therefore, it is possible to prevent the contact hole from being formed to extend through the polysilicon layer even if the lower polysilicon layer is excessively etched during the contact hole forming process, so that it is possible to obtain a reliable electric connection between the upper metallic interconnection layer and the lower polysilicon layer.

BRIEF DESCRIPTION OF THE DRAWINGS

FIG. 1 is a cross-sectional view showing a conventional semiconductor device;

FIG. 2 is a cross-sectional view showing a semiconductor device according to an embodiment of the present invention.

DETAILED DESCRIPTION OF THE PREFERRED EMBODIMENT AND METHOD

Figure 3A:
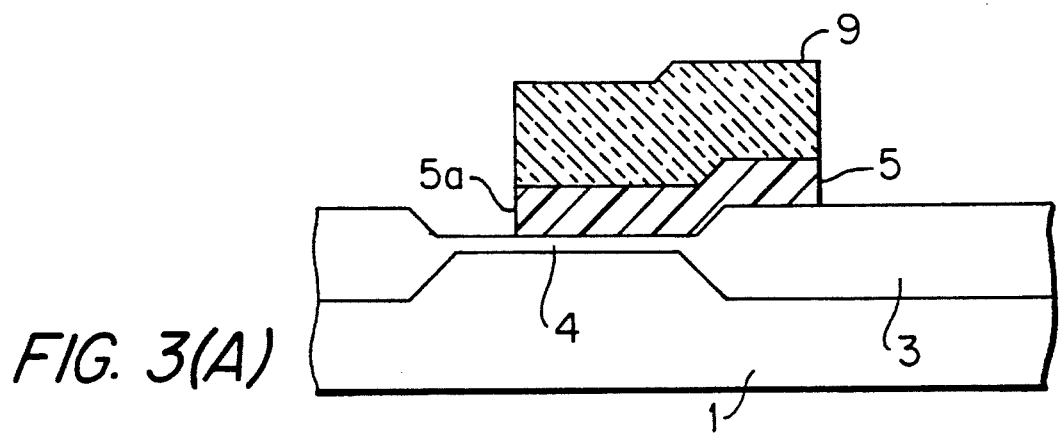
FIGS. 3(A)–3(D) are cross-sectional views for assistance in explaining the steps of a method of manufacturing the embodiment of the semiconductor device shown in FIG. 2.

A preferred embodiment and a preferred method of the present invention will be described herein below with reference to the attached drawings, in which like reference characters refer to corresponding elements.

FIG. 2 shows an embodiment of the semiconductor device according to the present invention. A gate oxide film 4 is formed on the surface of a P-type semiconductor. Substrate 1 and at an active area enclosed by an element isolating field oxide film 3 formed on substrate 1. A first polysilicon layer 5 (to be formed later into a gate electrode 5a and an interconnection layer 5b) is deposited on the gate oxide film 4. Further, an N+diffusion impurity region 2 (to be formed later into source/drain regions) is formed on both sides of gate electrode 5a and in substrate 1. A second polysilicon layer 6 is formed on field oxide film 3. An insulating film 7 is deposited on layers 3, 4, 5 and 6. This insulating film 7 has a flat upper side and comprises a $SiO_2$ film, e.g. boro-phospho-silicate glass. The thickness of insulating film 7 is not even. Namely, the thickness of insulating film 7 on the source/drain region 2 is about 4000–8000 angstrom, and the thickness of the insulating film on the polysilicon layers 5, 6 is about 2000–5000 angstrom. So, the thickness of the insulating film on the source/drain region is thicker than that of the insulating film on polysilicon layers 5,6. This is because of need for maintaining a flat surface on the upper side of the insulating film to facilitate formation of an electrically connecting layer. Contact holes are then formed at positions where interconnections are made. Namely, contact holes are opened to a middle depth of the desired portions of polysilicon layer 6 and through gate oxide film 4. An aluminum electrode layer 8 is formed on insulating film 7 and in the holes by aluminum evaporation. As is well understood, polysilicon layer portions 5b and 6b to be connected to the aluminum electrode layer 8 are formed thicker than the other polysilicon layer portions 5a and 6a, respectively. Also, the thickness of the polysilicon layer portions 5b and 6b to be connected is greater than that of gate oxide film 4.

Therefore, when contact holes are formed at these thicker portions for connection with the aluminum electrode layer 8, even if the polysilicon layer is excessively etched during the dry etching process, it is possible to prevent the holes from being formed completely through polysilicon layers 5b and 6b into oxide film 3.

FIGS. 3(A)–3(D) show steps of an example of a manufacturing process for the semiconductor device shown in FIG. 2, in accordance with a preferred method of the present invention. As shown in FIG. 3(A), a field region 3 is formed on the surface of a semiconductor substrate 1 by the well-known selective oxidation technique, and a gate insulating film 4 is formed by an appropriate method such as selective thermal oxidation. Further, a first polysilicon layer 5 including a gate region 5a is formed on film 4 by low pressure chemical vapor deposition (LPCVD), for instance.

Here, polysilicon layer 5 is formed with a thickness of about 4000 angstrom, since a connection will be formed at this point by a later process. Thereafter, first polysilicon layer 5 is formed into a desired shape by the well-known photoetching technique using photoresist 9.

Figure 3B:
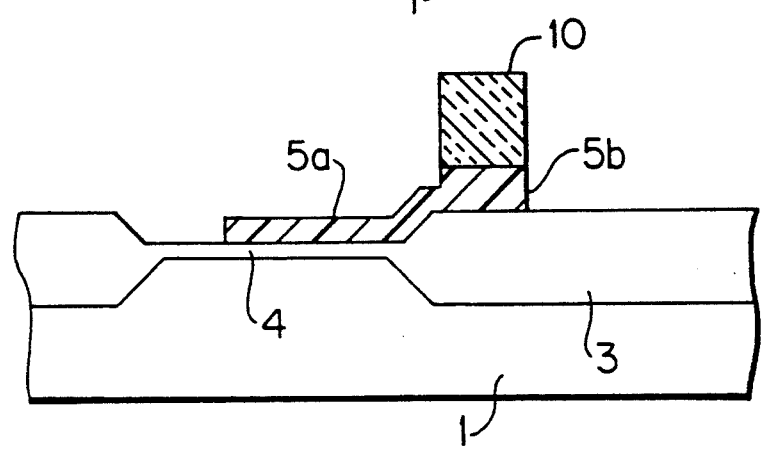

Thereafter, as shown in FIG. 3(B), first polysilicon layer 5 is uniformly etched, except a portion 5b which constitutes a contact, or connection, area, by the well-known photoetching technique using new photoresist 10, so that the thickness of remaining area 5a is reduced to a desired value less than the thickness of connection area 5b.

Figure 3C:
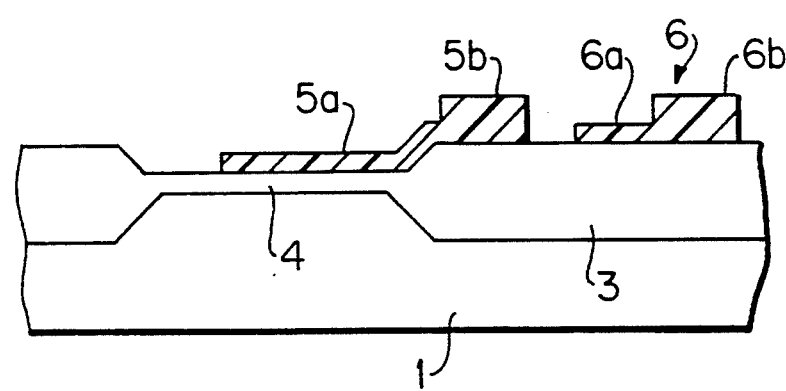

In the same way, as shown in FIG. 3(C), a second polysilicon layer 6 is formed and etched to yield a vertical contact area portion 6b having a thickness greater than a horizontal contact area portion 6a.

Figure 3D:
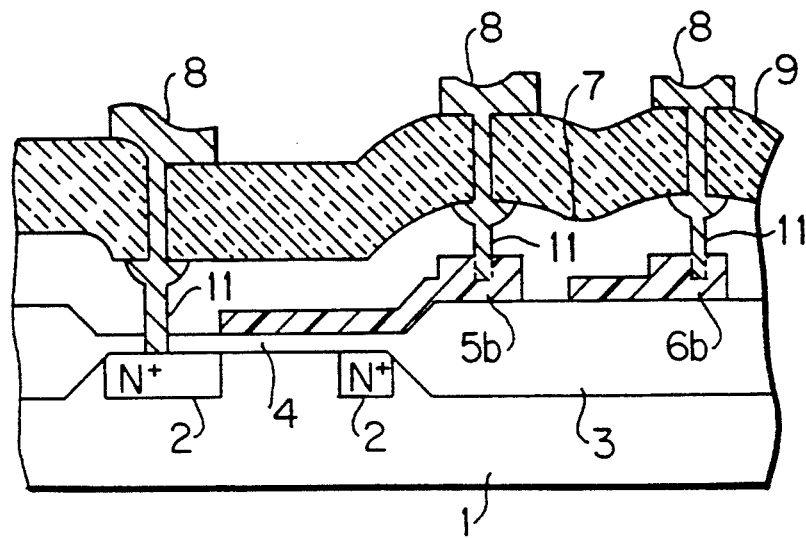

Thereafter, as shown in FIG. 3(D), a source/drain region 2 is formed, for example, by ion implantation, and a thick interlayer insulating layer 7 is formed. Further, holes 11 are formed in thick insulating layer 7 by using photoresist 9 formed by photoetching technology and dry etching using $SF_4$.

After photoresist 9 has been removed, an aluminum electrode layer 8 is formed to be connected to the polysilicon layers 5 and 6 at contact forming areas 5b and 6b, respectively.

As described above with reference to the embodiment, in the semiconductor device according to the present invention, since the film thickness at the contact areas of the polysilicon layer at which the polysilicon layer is connected to the metallic interconnection layer is formed greater than that at the other areas, to increase the margin of the polysilicon layer removed by etching for forming the contact holes, it is possible to obtain a reliable electric connection between the polysilicon layer and the metallic interconnection layer formed at the subsequent processes.

Numerous modifications and variations of the present invention are possible in light of the above teachings. It is therefore to be understood that, within the scope of the appended claims, the present invention can be practiced in a manner other than as specifically described herein.

We claim:

1. A semiconductor device comprising:
   (a) a semiconductor substrate having a source-drain area including an impurity region, and a field area;
   (b) a gate oxide layer disposed on the source-drain area;
   (c) a field oxide layer disposed on the field area and having a flat upper surface;
   (d) a polysilicon layer disposed on the flat upper surface of the field oxide layer and including a connection portion and a remaining portion having a thickness less than the connection portion;
   (e) an insulating layer disposed on the gate oxide layer, the field oxide layer, and the polysilicon layer;
   (f) means for defining a first hole through the insulating layer and the gate oxide layer, and for defining a second hole through the insulating layer and into the connection portion;
   (g) a first metallic interconnection formation dispose don the insulating layer and passing through the first hole to form an electrical connection with the impurity region; and
   (h) a second metallic interconnection formation disposed on the insulating layer and passing through the second hole to form an electrical connection with the polysilicon layer.

2. The semiconductor device as recited in claim 1, wherein the insulating layer includes a first portion of predetermined thickness on the impurity region and a second portion on the polysilicon layer having a thickness less than the predetermined thickness.

3. The semiconductor device as recited in claim 1, wherein the thickness of the connection portion of the polysilicon layer is greater than the thickness of the gate oxide layer on the impurity region.

4. A semiconductor device, comprising:
- a semiconductor substrate having a source-drain area including an impurity region and a field area;
- a gas oxide layer disposed on the source-drain area;
- a field oxide layer disposed on the field area and having a flat upper surface;
- a polysilicon layer comprising a connection portion and a remaining portion, the connection portion having a greater thickness than the remaining portion;
- an insulating layer formed on the polysilicon layer and having a hole formed therein above the connection portion; and
- a metallic interconnection layer formed on the insulating layer and having a portion extending through the hole to form electrical contact with the connection portion, the polysilicon layer being connected to the metallic interconnection layer via the portion extending through the hole.

* * * * *

UNITED STATES PATENT AND TRADEMARK OFFICE
CERTIFICATE OF CORRECTION

PATENT NO. : 5,321,296
DATED : June 14, 1994
INVENTOR(S) : Naoki Shouno

It is certified that error appears in the above-indentified patent and that said Letters Patent is hereby corrected as shown below:

Claim 1, column 4, lines 56-57, change "dispose don" to --disposed on--.

Claim 4, column 5, line 11, after "polysilicon layer" insert --formed on the flat upper surface of the field oxide layer, the polysilicon layer--.

Signed and Sealed this

Twenty-seventh Day of December, 1994

Attest:

BRUCE LEHMAN

Attesting Officer

Commissioner of Patents and Trademarks